United States Patent
Garlapati et al.

(10) Patent No.: US 9,268,891 B1
(45) Date of Patent: Feb. 23, 2016

(54) COMPACT AND EFFICIENT CIRCUIT IMPLEMENTATION OF DYNAMIC RANGES IN HARDWARE DESCRIPTION LANGUAGES

(71) Applicant: Xilinx, Inc., San Jose, CA (US)

(72) Inventors: Krishna Garlapati, Los Gatos, CA (US); Elliott Delaye, San Jose, CA (US); Ashish Sirasao, San Jose, CA (US); Bing Tian, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/535,267

(22) Filed: Nov. 6, 2014

(51) Int. Cl.
*G06F 17/50* (2006.01)
*G01R 31/317* (2006.01)
*G01R 31/3177* (2006.01)

(52) U.S. Cl.
CPC ........ *G06F 17/5045* (2013.01); *G01R 31/3177* (2013.01); *G01R 31/31703* (2013.01)

(58) Field of Classification Search
USPC ........................................ 716/101, 102, 103
See application file for complete search history.

(56) References Cited

U.S. PATENT DOCUMENTS

| | | | |
|---|---|---|---|
| 2010/0157670 A1* | 6/2010 | Chevallier et al. | 365/185.2 |
| 2012/0212280 A1* | 8/2012 | Ficke et al. | 327/333 |
| 2014/0269112 A1* | 9/2014 | Jung et al. | 365/189.11 |

* cited by examiner

*Primary Examiner* — Brian Ngo
(74) *Attorney, Agent, or Firm* — Kevin T. Cuenot

(57) ABSTRACT

Compiling a circuit design includes receiving the circuit design specified in a hardware description language, detecting, using a processor, a slice of a vector within the circuit design, and determining that the slice is defined by a left slice boundary variable and a right slice boundary variable. A hardware description is generated from the circuit design using the processor by including a first shifter circuit receiving the left slice boundary variable as an input signal, a second shifter circuit receiving the right slice boundary variable as an input signal, a control signal generator coupled to the first and second shifter circuits, and an output stage. The output stage, responsive to a control signal dependent upon an output from the first shifter circuit and an output from second shifter circuit, generates an output signal including newly received values from a data signal only for bit locations of the output signal corresponding to the slice.

20 Claims, 6 Drawing Sheets

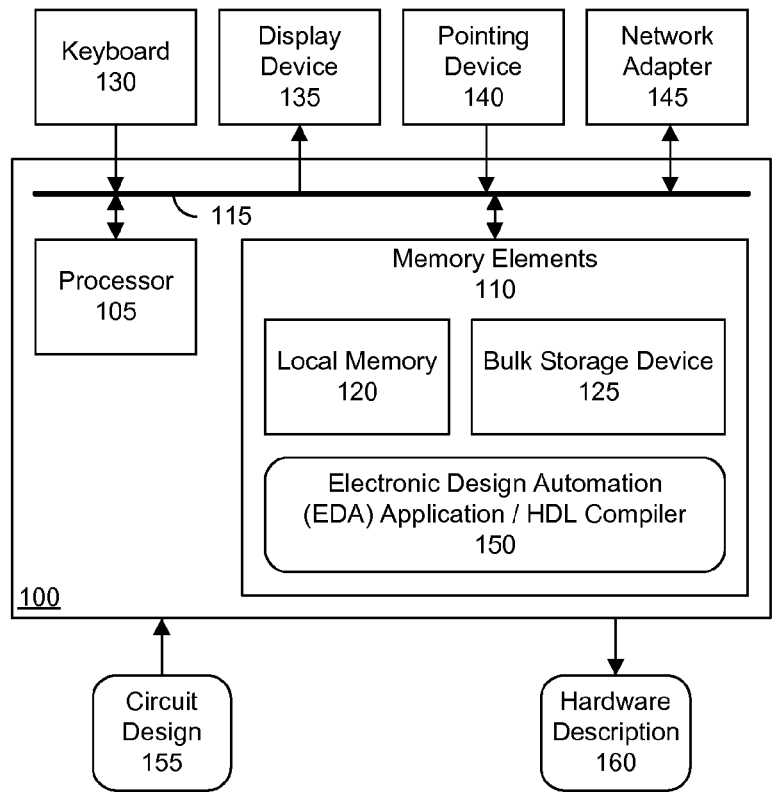

FIG. 1

```
200    library ieee;
       use ieee.std_logic_1164.all;

entity top is port(
          clk : in std_logic;
          lindex, rindex : in integer range 15 downto 0;
          datain : in std_logic_vector(15 downto 0);
          dout : out std_logic_vector(15 downto 0));
       end top;

architecture arch of top is
       begin process(clk) begin
           if (clk'event and clk = '1') then
             dout(lindex downto rindex) <= datain(lindex downto rindex);
           end if;
         end process;

end architecture;
```

FIG. 2

COMPACT AND EFFICIENT CIRCUIT IMPLEMENTATION OF DYNAMIC RANGES IN HARDWARE DESCRIPTION LANGUAGES

FIELD OF THE INVENTION

This disclosure relates to integrated circuits (ICs) and electronic design. More particularly, this disclosure relates to using dynamic ranges in hardware description languages and implementing dynamic ranges in circuitry.

BACKGROUND

A hardware description language (HDL) is a computer-language that facilitates the documentation, design, and manufacturing of a digital system, such as an integrated circuit (IC). Implementation of the digital system may include the transformation of the digital system into a set of masks for IC manufacturing, the programming of a programmable IC such as a field programmable gate array (FPGA), or the like. Using an HDL, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages such as C or C++, an HDL also includes an explicit notion of time such as the inclusion of clock signals, which is a primary attribute of a digital system.

Within HDL design, signals may be defined as a vector of bits. Various portions of the digital system may access a portion of the vector referred to as a "slice." For example, different portions of the digital system may utilize different slices of the vector, where a "slice" is one or more consecutive bits of the vector and may be the entire vector. In many cases, when specifying the slice of the vector that a particular portion of the digital system is to use, the upper and lower bounds of that slice must be resolved to constants within the HDL design.

In other cases, HDL compilers may allow the upper and lower bounds of the slice to be specified dynamically. Such HDL compilers, however, implement the dynamically specified bounds of the slice as circuitry in which all possible and legal slices of the vector are made available. The circuitry is typically implemented using a multiplexer having a significant number of inputs. The number of inputs to a multiplexer used in circuitry to generate all possible and legal slices of a vector is defined by the expression $n(n+1)/2$, where "n" is the size of the vector in bits. As may be seen from the expression, even a small vector of 4 bits requires a relatively large circuit that utilizes a 10 input multiplexer not including the enable signals. Each of the 10 inputs to the multiplexer is a 4 bit input. In the case of a 4 bit vector, all possible and legal slices of the vector are: [3:3], [3:2], [3:1], [3:0], [2:2], [2:1], [2:0], [1:1], [1:0], and [0:0], where the first number indicates the bit position of the left boundary of the slice and the second number indicates the bit position of the right boundary of the bit position. The resulting circuitry consumes significant IC resources and IC area.

SUMMARY

A method of compiling a circuit design includes receiving the circuit design specified in a hardware description language, detecting, using a processor, a slice of a vector within the circuit design, and determining that the slice is defined by a left slice boundary variable and a right slice boundary variable. The method includes generating a hardware description from the circuit design using the processor by including a first shifter circuit receiving the left slice boundary variable as an input signal, a second shifter circuit receiving the right slice boundary variable as an input signal, a control signal generator coupled to the first and second shifter circuits, and an output stage. The output stage, responsive to a control signal dependent upon an output from the first shifter circuit and an output from second shifter circuit, is configured to generate an output signal including newly received values from a data signal only for bit locations of the output signal corresponding to the slice.

A circuit includes a first shifter circuit configured to generate a first shifted signal by shifting a first constant value by a first variable amount, a second shifter circuit configured to generate a second shifted signal by shifting a second constant value by a second variable amount, and a control signal generator configured to generate a control signal using the first shifted signal and the second shifted signal. The circuit includes an output stage coupled to the control signal and configured to receive a data signal. The output stage is configured to generate an output signal including newly received values of the data signal only for bit locations selected by the control signal.

A system includes a processor programmed to initiate executable operations. The executable operations include receiving a circuit design specified in a hardware description language, detecting a slice of a vector within the circuit design, determining that the slice is defined by a left slice boundary variable and a right slice boundary variable, and generating a hardware description from the circuit design. The hardware description is generated by including a first shifter circuit receiving the left slice boundary variable as an input signal, a second shifter circuit receiving the right slice boundary variable as an input signal, a control signal generator coupled to the first and second shifter circuits, and an output stage. The output stage, responsive to a control signal dependent upon an output from the first shifter circuit and an output from second shifter circuit, generates an output signal including only newly received values from a data signal for bit locations of the output signal corresponding to the slice.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 1 is a block diagram illustrating an exemplary data processing system.

FIG. 2 is an exemplary portion of hardware description language code.

FIGS. 4-1 and 4-2 are block diagrams illustrating additional exemplary circuits.

DETAILED DESCRIPTION OF THE DRAWINGS

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and electronic design. More particularly, this disclosure relates to using dynamic ranges in hardware description languages (HDLs) and implementing dynamic ranges in circuitry. In accordance with the inventive arrangements described herein, dynamic ranges may be used to represent a left boundary and a right boundary of a slice of a vector of bits. A circuit design specified in HDL that includes one or more slices of a vector, or vectors, with dynamically specified left and right boundaries may be processed by a system executing an electronic design automation (EDA) application. The system may generate circuitry, or a description thereof, that consumes fewer IC resources than other known techniques for processing dynamically specified boundaries of a slice of a vector.

The inventive arrangements described herein may be implemented as a method or process performed by a data processing system. In another aspect, the inventive arrangements may be implemented as a data processing system having a processor. The processor, upon executing program code, generates a hardware description from a circuit design as described herein. The circuit design may be implemented within an IC. In still another aspect, the inventive arrangements may be implemented as a non-transitory computer-readable storage medium storing program code that, when executed, causes a processor and/or a system to perform and/or initiate a method or process. In yet another aspect, the inventive arrangements may be implemented as a circuit or circuitry and may be included or implemented within an IC.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

Figures 1, 4:
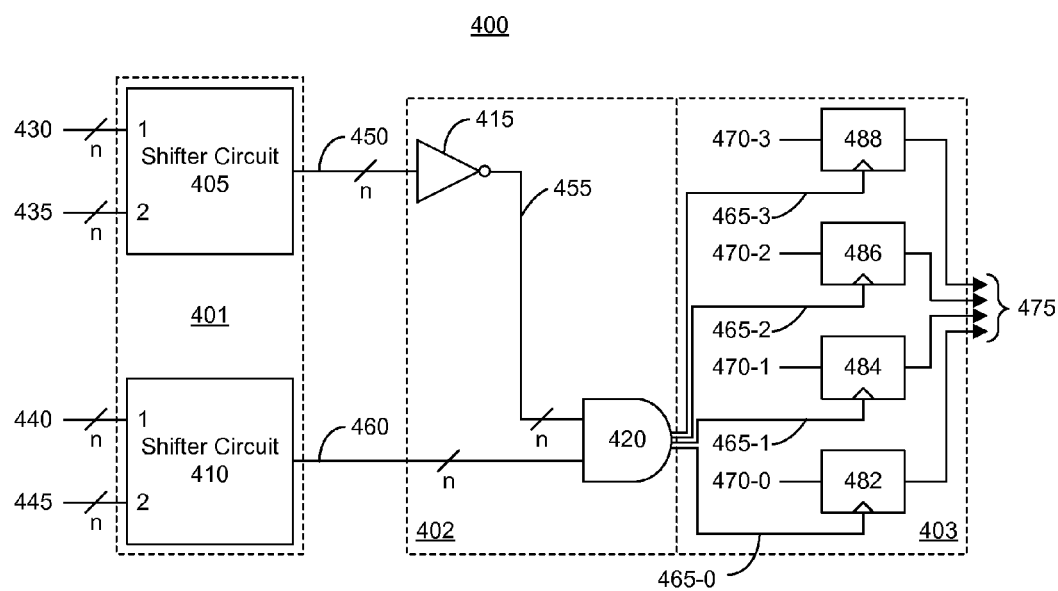

FIG. 1 is a block diagram illustrating an exemplary data processing system (system) 100. System 100 includes at least one processor, e.g., a central processing unit (CPU), 105 coupled to memory elements 110 through a system bus 115 or other suitable circuitry. System 100 stores program code within memory elements 110. Processor 105 executes the program code accessed from memory elements 110 via system bus 115. In one aspect, system 100 is implemented as a computer or other data processing system that is suitable for storing and/or executing program code. It should be appreciated, however, that system 100 may be implemented in the form of any system including a processor and memory that is capable of performing the functions described within this disclosure.

Memory elements 110 include one or more physical memory devices such as, for example, a local memory 120 and one or more bulk storage devices 125. Local memory 120 refers to random access memory (RAM) or other non-persistent memory device(s) generally used during actual execution of the program code. Bulk storage device 125 may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from bulk storage device 125 during execution.

Input/output (I/O) devices such as a keyboard 130, a display device 135, and a pointing device 140 may optionally be coupled to system 100. The I/O devices may be coupled to system 100 either directly or through intervening I/O controllers. A network adapter 145 may also be coupled to system 100 to enable system 100 to become coupled to other systems, computer systems, remote printers, and/or remote storage devices through intervening private or public networks. Modems, cable modems, Ethernet cards, and wireless transceivers are examples of different types of network adapter 145 that may be used with system 100.

As pictured in FIG. 1, memory elements 110 store an EDA application 150. EDA application 150, for example, may be, or include, an HDL compiler. EDA application 150, being implemented in the form of executable program code, is executed by system 100. For example, processor 105 executes the instructions specified within EDA application 150. Accordingly, EDA application 150 is considered an integrated part of system 100. System 100, while executing EDA application 150, receives and operates upon a circuit design 155. Circuit design 155 is a programmatic description of circuitry to be implemented within an IC. For example, circuit design 155 may be specified using an HDL.

System 100 operates upon circuit design 155 to perform one or more design flow and/or HDL compilation operations. Subsequently, system 100 generates hardware description 160 from circuit design 155. In one example, hardware description 160 may be a netlist. In the case of a programmable IC such as an FPGA, for example, the netlist may specify gates and/or primitives of FPGA cells and connectivity of such elements. EDA application 150, circuit design 155, hardware description 160, and any data items used, generated, and/or operated upon by EDA application 150 are functional data structures that impart functionality when employed as part of system 100 or when such elements, including derivations thereof, are loaded into an IC such as a programmable IC.

Figures 2, 4:
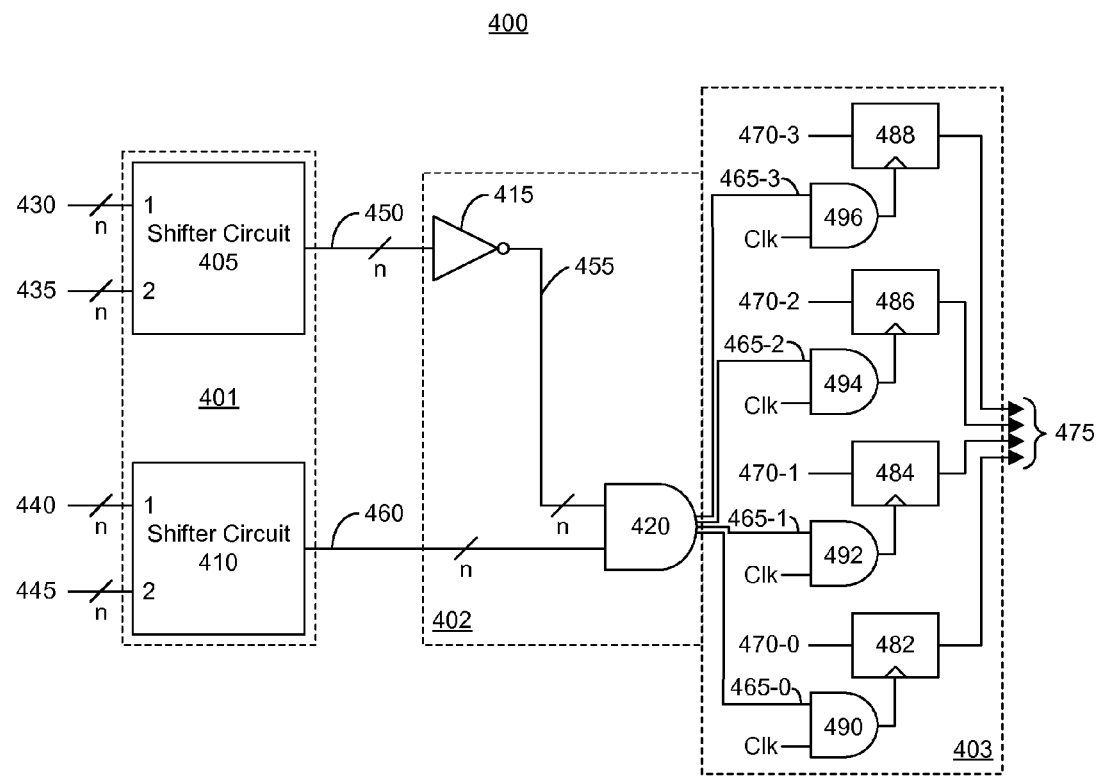

FIG. 2 is an exemplary portion of HDL code 200. In the example of FIG. 2, HDL code 200 is specified in VHDL. For purposes of illustration, circuit design 155 may specify, or include, HDL code 200.

As pictured in FIG. 2, an entity called "top" is declared having a port with a clock signal input (clk), a data input having a width of 16 bits (datain), and a data output having a width of 16 bits (dout). The variables "lindex" and "rindex", which stand for "left index" and "right index," respectively, are defined as integers in the range of 0 to 15. The architecture declaration for the entity "top" defines a process for "clk" where, if "clk" evaluates to a 1 on a clock event, the statement "dout(lindex downto rindex)<=datain(lindex downto rindex);" is executed. In this example, "dout" is a slice of the vector "datain" with the left boundary, e.g., bit position, of the slice defined by the left index variable "lindex" and the right boundary, e.g., bit position, of the slice defined by the right index variable "rindex." The output, e.g., "dout," which is a standard logic vector, is fewer bits than the input "datain," which is also a standard logic vector.

Figure 3:
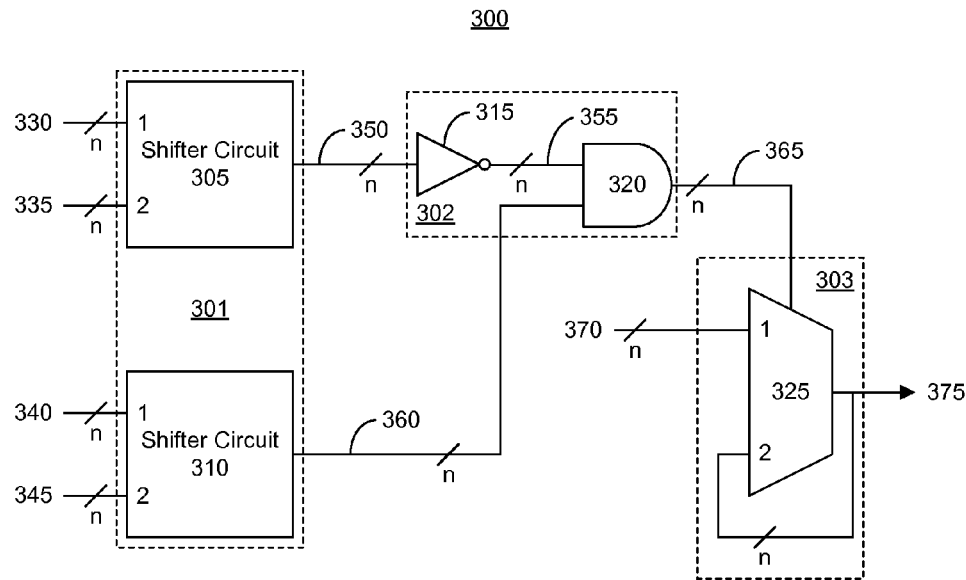
FIG. 3 is a block diagram illustrating an exemplary circuit.

FIG. 3 is a block diagram illustrating an exemplary circuit 300. Circuit 300 is an example of circuitry generated by compiling HDL code 200 of FIG. 2 or other HDL program code using dynamic boundaries for a slice of a vector. As such, circuit 300 is configured to provide, or output, a slice of a vector of bits where the slice has a dynamically specified left boundary and a dynamically specified right boundary. The left and right boundaries are specified as variables in the HDL design.

As pictured, circuit 300 includes an input stage 301, a control signal generator 302, and an output stage 303. Input stage 301 includes a shifter circuit 305 and a shifter circuit 310. Control signal generator 305 includes an inverter 315 and an AND circuit 320. In the example of FIG. 3, output stage 303 includes a multiplexer 325.

Shifter circuit 305 has a first input that receives a data signal 330. Data signal 330 specifies a constant having a value of −2. In one aspect, the constant value of −2 is binary encoded using two's complement. Shifter circuit 305 includes a second input that receives signal 335. Signal 335 specifies a left boundary of a slice of the vector that is output from multiplexer 325 as output signal 375, e.g., "dout." Signal 335 implements the variable "lindex" from HDL code 200 of FIG. 2.

Shifter circuit 310 has a first input that receives a data signal 340. Data signal 340 specifies a constant having a value of −1. In one aspect, the constant value of −1 is binary encoded using two's complement. Shifter circuit 310 includes a second input that receives signal 345. Signal 345 specifies a right boundary of the slice of the vector that is output from multiplexer 325 as output signal 375. Signal 345 implements the variable "rindex" from HDL code 200 of FIG. 2.

Shifter circuit 305 is configured to perform a logical left shift operation of data signal 330 by the number of bit positions specified by signal 335. Shifter circuit 310 is configured to perform a logical left shift operation of data signal 340 by the number of bit positions specified by signal 345.

Shifter circuit 305 outputs signal 350 to an input of inverter 315. Inverter 315 inverts signal 350, thereby generating signal 355 from the output of inverter 315 and providing signal 355 to a first input of AND circuit 320. Shifter circuit 310 outputs signal 360 to a second input of AND circuit 320. AND circuit 320 performs a Boolean AND operation between signals 355 and 360, thereby outputting control signal 365. In this example, control signal 365 is a select signal for multiplexer 325 and is provided to a select port of multiplexer 325.

Multiplexer 325 includes two inputs. A first input of multiplexer 325 receives a data signal 370 as an input signal. For example, data signal 370 may be "datain." A second input of multiplexer 325 receives output signal 375 fed back thereto. As each of signals 330, 335, 340, 345, 350, 355, 360, 365, 370, and 375 are multi-bit signals having "n" bits, signal 375 is formed of the entirety of signal 370, a mix of bits from signal 370 and bits from signal 375 of a prior clock cycle, or the entirety of signal 375 from a prior clock cycle. Signal 375, being fed back from the output to the input, provides values from the output of multiplexer 325 from the prior clock cycle. Appreciably, when outputting a bit from signal 375 instead of signal 370, multiplexer 325 is outputting the value for that particular bit location of the slice from the prior clock cycle.

Any bits of output signal 375 passed from the second input of multiplexer 325, therefore, do not change for the current clock cycle. Any bits of output signal 375 passed from the first input of multiplexer 325 are new bits from the received signal 370, which may or may not change depending upon values specified by signal 370. The desired slice to be output includes new values in each bit location taken from data signal 370, while bit locations not included in the desired slice have values taken from output signal 375 as fed back to the second input of multiplexer 325.

In illustration, consider an example where the vector being processed is 4-bits (e.g., n=4). In this example, the desired slice of the vector is [2:0]. Thus, the value of lexpr is 2. The value of rexpr is 0. Shifter circuit 305 performs a logical left shift of the value specified by data signal 330. The value of data signal 330 is shifted left by a number of bits specified by the value of signal 335 (lexpr). Thus, the two's complement binary representation of −2, which is 1110, is shifted left by 2 bits. Shifter circuit 305 performs a logical left shift of −2 by 2 bits by filling in zeros for the vacant bit locations created on the right. The shifted value of 1110 is 1000 as specified by signal 350. Inverter 315 receives the value 1000 and generates an inverted value of 0111 as signal 355, which is provided to the first input of AND circuit 320.

Shifter circuit 310 performs a logical left shift of the value specified by data signal 340. The value of data signal 340 is shifted left by a number of bits specified by the value of signal 345 (rexpr). Thus, the two's complement binary representation of −1, which is 1111, is shifted left by 0 bits. Shifter circuit 310, therefore, outputs the value of 1111 as signal 360, which is provided to the second input of AND circuit 320.

AND circuit 320 performs a Boolean AND operation on signals 355 and 360 having values of 0111 and 1111, respectively. AND circuit 320 generates control signal 365 having a value of 0111 as the multiplexer selector signal provided to the selector port of multiplexer 325. The value 0111 causes multiplexer 325 to output bit 3 of signal 375 from the second input, and bits 0, 1, and 2 of data signal 370 from the first input. This example presumes bit positions for the 4-bit vector of [3 2 1 0]. The values for bit positions 2, 1, and 0 are new values as received from data signal 370. The value for bit position 3 is the value from the prior clock cycle as previously output from multiplexer 325 as signal 375 and fed back to the second input of multiplexer 375.

FIG. 4-1 is a block diagram illustrating another exemplary circuit 400. Circuit 400 is another example of circuitry generated by compiling HDL code 200 of FIG. 2 or other HDL program code using dynamic boundaries for a slice of a vector. Circuit 400 is implemented substantially similar to circuit 300 of FIG. 3.

As pictured, circuit 400 includes an input stage 401, a control signal generator 402, and an output stage 403. Input stage 401 includes a shifter circuit 405 and a shifter circuit 410. Control signal generator 405 includes an inverter 415 and an AND circuit 420. One difference between circuit 300 and circuit 400 is that output stage 403 of circuit 400 is implemented using a plurality of memory elements. Further, the control signal that is generated is used to control the memory elements.

Each of signals 430, 435, 440, 445, 450, 455, 460, 465, 470, and 475 are multi-bit signals of "n" bits. The number of memory elements included within output stage 403 will also be equal to "n." As pictured, control signal 465 as output from AND circuit 420 is used as a control signal for each of memory elements 482, 484, 486, and 488. For purposes of illustration, the value of n is selected to be 4. Accordingly, control signals 465, data signal 470, and output signal 475 are broken out into individual bit signals to better illustrate operation of memory elements 482, 484, 486, and 488.

Using the prior example, the value of signal 435 (lexpr) is 2 and the value of signal 445 (rexpr) is 0. Data signal 430 specifies a constant value of −2, while data signal 440 specifies a constant value of −1. As discussed, the values of the −2 and −1 constants may be specified using two's complement. In that case, the output from AND circuit 420 is 0111. Thus, signal 465-0 specifies a 1. Signal 465-1 specifies a 1. Signal 465-2 specifies a 1. Signal 465-3 specifies a 0.

In one aspect, each of memory elements 482, 484, 486, and 488 may be implemented as a latch. In that case, control signals 465-0, 465-1, 465-2, and 465-3 may be used as gate signals for memory elements 482, 484, 486, and 488, respectively. Each of memory elements 482, 484, 486, and 488, for example, may include a control input configured to receive the gate signal.

Since control signal 465-0 specifies a 1, memory element 482 latches, or stores, the value from data signal 470-0. Control signal 465-1 specifies a 1, thereby causing memory element 484 to store a value from data signal 470-1. Control signal 465-2 specifies a 1, thereby causing memory element 486 to store a value from data signal 470-2. Control signal 465-3, however, specifies a 0. As such, memory element 488 does not store a value from data signal 470-3. Memory element 488 continues to store the value from the last time that memory element 488 was activated, i.e., where signal 465-3 had a value of 1.

In another aspect, each of memory elements 482, 484, 486, and 488 may be implemented as a register. In that case, control signals 465-0, 465-1, 465-2, and 465-3 may be used as clock enable signals for memory elements 482, 484, 486, and 488, respectively. In this example, the clock signal to each of memory elements 482, 484, 486, and 488 is not shown. Each of memory elements 482, 484, 486, and 488 may include control inputs including a clock input and a clock enable input, where the clock enable input is configured to receive the gate signal.

Since control signal 465-0 specifies a 1 as the clock enable, memory element 482 stores the value from data signal 470-0. Control signal 465-1 specifies a 1 as the clock enable, thereby causing memory element 484 to store a value from data signal 470-1. Control signal 465-2 specifies a 1 as the clock enable, thereby causing memory element 486 to store a value from data signal 470-2. Control signal 465-3, however, specifies a 0. As such, memory element 488 does not store a value from data signal 470-3. Memory element 488 continues to store the value from the last time that memory element 488 was clock enabled, i.e., where signal 465-3 had a value of 1.

Accordingly, output signal 475 is the combination of individual outputs from memory elements 482, 484, 486, and 488. Circuit 400 provides the output as circuit 300 using memory elements in place of a multiplexer.

FIG. 4-2 is a block diagram illustrating another exemplary implementation of circuit 400. In the example of FIG. 4-2, memory elements 482, 484, 486, and 488 are implemented as registers. As pictured, control signals 465-0, 465-1, 465-2, and 465-3 are coupled to AND circuits 490, 492, 494, and 496, respectively. Each of AND circuits 490, 492, 494, and 496 also receives a clock signal illustrated as "Clk", e.g., a same clock signal. Each of memory elements 482, 484, 486, and 488 may include a control input such as a clock input configured to receive a control signal output from AND circuits 490, 492, 494, and 496, respectively, in this example.

By performing a logical AND operation on the relevant control signal and the clock signal, the corresponding memory element is clocked and thereby stores a value from the data signal responsive to both the control signal and the clock signal taking on a logical value of 1. The clock signal to the memory element is effectively "killed," e.g., not allowed to transition or forced to a logic 0, while the control signal to the AND circuit is a logic 0.

Referring to the prior example, when control signal 465-0 specifies a 1, Clk is allowed to pass through AND circuit 490 to memory element 482. With control signal 465-0 and Clk each specifying a 1, AND circuit 490 outputs a 1 thereby clocking memory element 482 so that memory element 482 accepts the value from data signal 470-0. When control signal 465-1 specifies a 1, Clk is allowed to pass through AND circuit 492 to memory element 484. With control signal 465-1 and Clk each specifying a 1, AND circuit 492 outputs a 1 thereby clocking memory element 484 so that memory element 484 accepts a value from data signal 470-1. When control signal 465-2 specifies a 1, Clk is allowed to pass through AND circuit 494 to memory element 486. With control signal 465-2 and Clk each specifying a 1, AND circuit 494 outputs a 1, thereby clocking register 486 so that memory element 486 accepts a value from data signal 470-2. Finally, control signal 465-3 specifies a 0, which causes the output of AND circuit 496 to go to 0 regardless of the value of Clk. As such, memory element 488 is prevented from accepting a value from data signal 470-3.

As discussed with reference to FIG. 4-1, output signal 475 is the combination of individual outputs from memory elements 482, 484, 486, and 488. Circuit 400 provides the output as circuit 300 using memory elements in place of a multiplexer.

Figure 5:
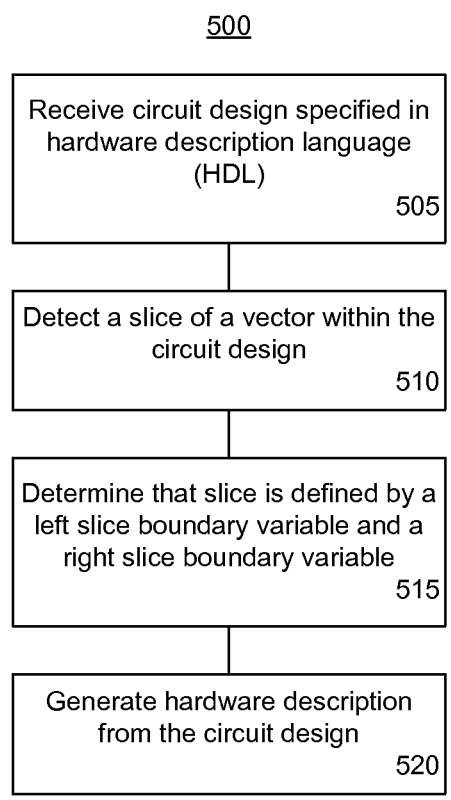
FIG. 5 is a flow chart illustrating a method of implementing circuitry from an HDL description of a circuit design.

FIG. 5 is a flow chart illustrating a method 500 of implementing circuitry from an HDL description of a circuit design. Method 500 may be implemented by a system such as system 100 of FIG. 1. In block 505, the system receives a circuit design specified in an HDL. In block 510, the system detects a slice of a vector within the circuit design. In block 515, the system determines that the slice is defined by a left slice boundary variable, e.g., lexpr, and a right slice boundary variable, e.g., rexpr. In block 520, the system generates a hardware description from the circuit design. More particularly, the system generates a hardware description for circuitry that generates the slice of the vector as specified within the circuit design.

Figure 6:
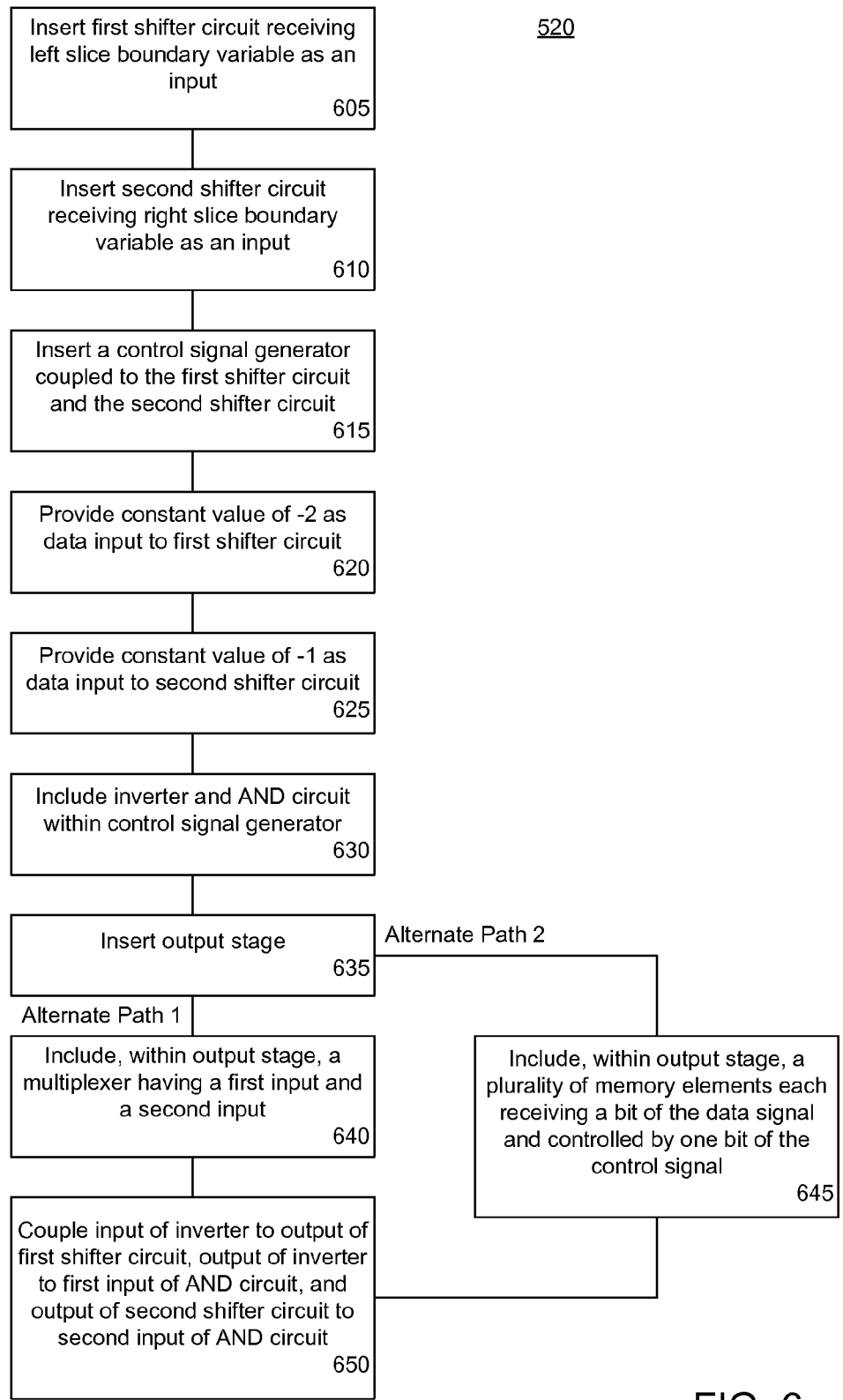
FIG. 6 is a flow chart illustrating an exemplary implementation of block 515 of FIG. 5.

FIG. 6 is a flow chart illustrating an exemplary implementation of block 515 of FIG. 5. FIG. 6 describes the operations performed by the system in creating a circuit implementation that generates the slice of the vector included in the HDL circuit design. Other circuit structures specified by the HDL circuit design may be implemented using known circuit generation and/or HDL compilation techniques.

In block 605, the system inserts a first shifter circuit into the circuit design. The first shifter circuit receives the left slice boundary variable as an input signal. In block 610, the system inserts a second shifter circuit receiving the right slice boundary variable as an input signal. In block 615, the system inserts a control signal generator coupled to the first shifter circuit and the second shifter circuit.

In block 620, the system provides a constant value of −2 as a data input to the first shifter circuit. As noted, the constant value of −2 may be specified using two's complement. The first shifter circuit is configured to shift the constant value of −2 by a number of bits specified by the left slice boundary variable (lexpr).

In block 625, the system provides a constant value of −1 as a data input to the second shifter circuit. As noted, the constant value of −1 may be specified using two's complement.

The second shifter is configured to shift the constant value of −1 by a number of bits specified by the right slice boundary variable (rexpr).

In block 630, the system includes an inverter and an AND circuit within the control signal generator.

In block 635, the system inserts an output stage. In one aspect, the output stage is responsive to a control signal that is dependent upon an output from the first shifter circuit and an output of from the second shifter circuit. The output stage may generate an output signal including only newly received values from a data signal for bit locations of the output signal corresponding to the slice.

In FIG. 6, blocks 640 and 645 represent alternate paths. The system will execute either block 640 or block 645. In one aspect, whether the system implements block 640 or block 645 may depend upon a preference and/or setting within the system that may be set by a user and/or a circuit designer. Block 640, for example, implements a multiplexer within the output stage. Block 645 implements multiple memory elements within the output stage.

In block 640, the system includes, within the output stage, a multiplexer that includes a first input and a second input. The first input may be configured to receive the data signal. The second input may be configured to receive an output signal from the multiplexer that is fed back. It should be appreciated that unlike other conventional techniques, the number of inputs to the multiplexer is constant and, therefore, not dependent upon the number of bits in the vector from which the slice is obtained. It should be appreciated, however, that each of the two inputs will be n bits in width, where the width of the vector is n bits.

In block 645, the system may include, within the output stage, a plurality of memory elements. For a vector of n bits, the system will include n memory elements. Each memory receives a bit, e.g., one bit, of the data signal. Further each memory element is controlled by one bit of the control signal. The particular configuration of the memory elements and corresponding implementation and/or use of the control signals may be implemented as described with reference to the examples for any of FIG. 4-1 or 4-2. The particular implementation that is used may be selected by a user and/or designer through a preference setting within the system.

In block 650, the system couples an input of the inverter to an output of the first shifter circuit, couples an output of the inverter to a first input of the AND circuit, and couples an output of the second shifter to a second input of the AND circuit. The output of the AND circuit is the control signal. As discussed, the control signal is used as a select signal provided to a select port for the multiplexer implementation of the output stage. The control signal is used as a clock signal for the registers for the register implementation of the output stage.

Figure 7:
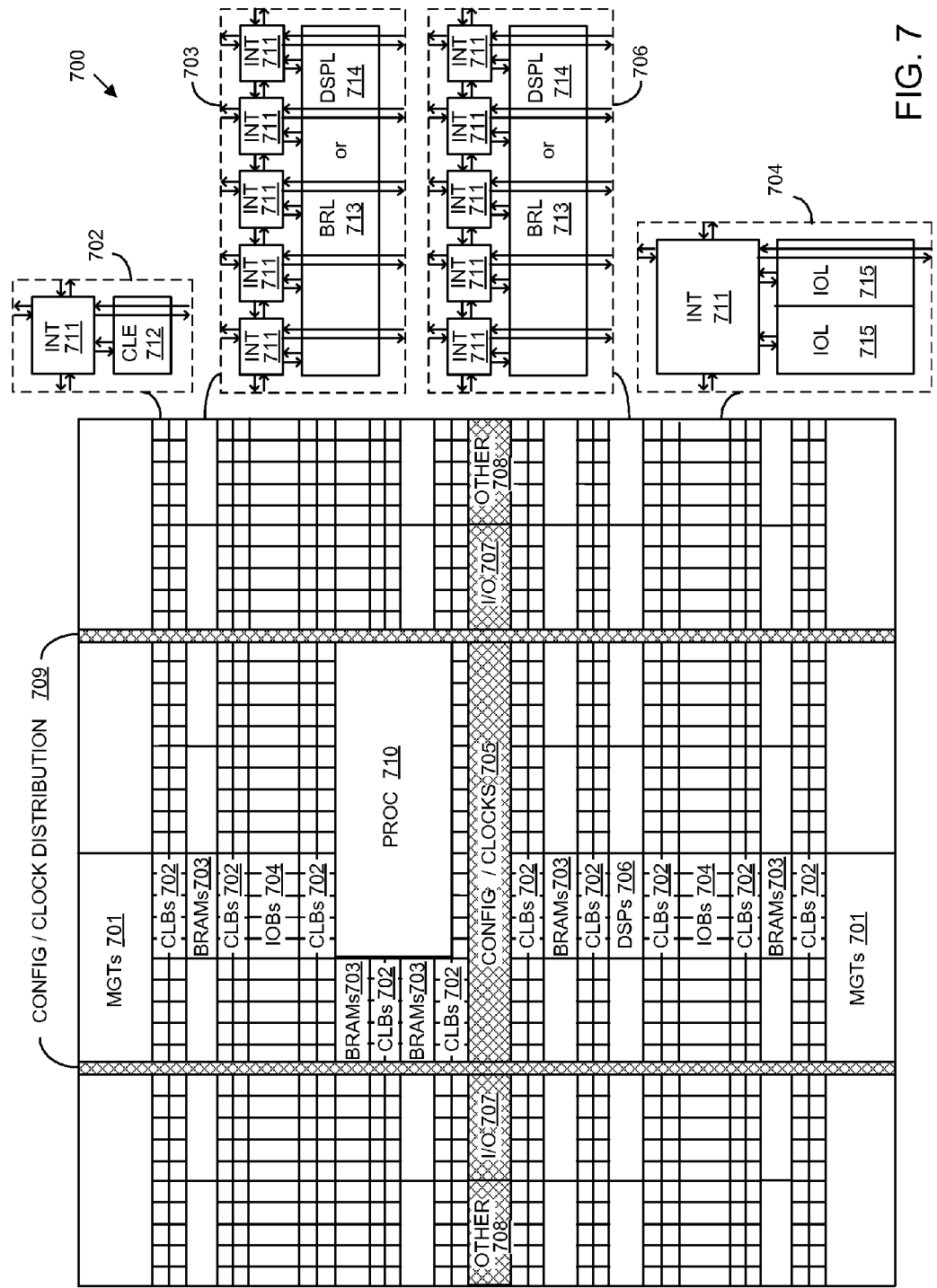
FIG. 7 is a block diagram illustrating an exemplary architecture for an integrated circuit.

FIG. 7 is a block diagram illustrating an exemplary architecture 700 for an IC. For example, architecture 700 may be used to implement an IC that includes the exemplary circuits described with reference to FIGS. 3 and 4 as may be generated from processing an HDL circuit design including a slice of a vector of bits.

In one aspect, architecture 700 is implemented within a field programmable gate array (FPGA) type of IC. Architecture 700 is also representative of an SOC type of IC. An SOC is an IC that includes a processor that executes program code and one or more other circuits and/or circuit systems. The circuits and/or circuit systems may operate cooperatively with one another and with the processor.

As shown, architecture 700 includes several different types of programmable circuit, e.g., logic, blocks. For example, architecture 700 may include a large number of different programmable tiles including multi-gigabit transceivers (MGTs) 701, configurable logic blocks (CLBs) 702, random access memory blocks (BRAMs) 703, input/output blocks (IOBs) 704, configuration and clocking logic (CONFIG/CLOCKS) 705, digital signal processing blocks (DSPs) 706, specialized I/O blocks 707 (e.g., configuration ports and clock ports), and other programmable logic 708 such as digital clock managers, analog-to-digital converters, system monitoring logic, and so forth.

In some ICs, each programmable tile includes a programmable interconnect element (INT) 711 having standardized connections to and from a corresponding INT 711 in each adjacent tile. Therefore, INTs 711, taken together, implement the programmable interconnect structure for the illustrated IC. Each INT 711 also includes the connections to and from the programmable logic element within the same tile, as shown by the examples included at the top of FIG. 7.

For example, a CLB 702 can include a configurable logic element (CLE) 712 that may be programmed to implement user logic plus a single INT 711. A BRAM 703 may include a BRAM logic element (BRL) 713 in addition to one or more INTs 711. Typically, the number of INTs 711 included in a tile depends on the height of the tile. As pictured, a BRAM tile has the same height as five CLBs, but other numbers (e.g., four) may also be used. A DSP tile 706 may include a DSP logic element (DSPL) 714 in addition to an appropriate number of INTs 711. An 10B 704 may include, for example, two instances of an I/O logic element (IOL) 715 in addition to one instance of an INT 711. As will be clear to those of skill in the art, the actual I/O pads connected, for example, to IOL 715 typically are not confined to the area of IOL 715.

In the example pictured in FIG. 7, a columnar area near the center of the die, e.g., formed of regions 705, 707, and 708, may be used for configuration, clock, and other control logic. Horizontal areas 709 extending from this column are used to distribute the clocks and configuration signals across the breadth of the programmable IC.

Some ICs utilizing the architecture illustrated in FIG. 7 include additional logic blocks that disrupt the regular columnar structure making up a large part of the IC. The additional logic blocks may be programmable blocks and/or dedicated circuitry. For example, a processor block depicted as PROC 710 spans several columns of CLBs and BRAMs.

In one aspect, PROC 710 is implemented as a dedicated circuitry, e.g., as a hardwired processor, that is fabricated as part of the die that implements the programmable circuitry of the IC. PROC 710 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 710 is omitted from architecture 700 and replaced with one or more of the other varieties of the programmable blocks described. Further, such blocks may be utilized to form a "soft processor" in that the various blocks of programmable circuitry may be used to form a processor that executes program code as is the case with PROC 710.

The phrase "programmable circuitry" means programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 7 that are external to PROC 710 such as CLBs 702 and BRAMs 703 are considered programmable circuitry of the IC. Programmable circuitry may be configured or programmed to implement different physical circuits therein.

In general, the functionality of programmable circuitry is not established until configuration data is loaded into the IC. A set of configuration bits may be used to program programmable circuitry of an IC such as an FPGA. The configuration bit(s) are typically referred to as a "configuration bitstream." In general, programmable circuitry is not operational or functional without first loading a configuration bitstream into the IC. The configuration bitstream effectively implements or instantiates a particular physical circuit within the programmable circuitry. The configuration bitstream or circuit design specifies, for example, functional aspects of the programmable circuit blocks and physical connectivity among the various ones of the programmable circuit blocks that is otherwise non-existent.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry has dedicated circuit blocks and interconnects, for example, that are functional without first loading a configuration bitstream into the IC. An example of hardwired circuitry is PROC 710.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

FIG. 7 is intended to illustrate an exemplary architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 7 are purely exemplary. In an actual IC, for example, more than one adjacent column of CLBs may be included wherever the CLBs appear, to facilitate the efficient implementation of a user circuit design. The number of adjacent CLB columns, however, may vary with the overall size of the IC. Further, the size and/or positioning of blocks such as PROC 710 within the IC are for purposes of illustration only and are not intended as a limitation.

In accordance with the inventive arrangements described within this disclosure, a circuit design expressed in HDL that specifies slices of a vector dynamically may be implemented in circuitry in an efficient and compact manner. The size and/or amount of resources utilized by the circuitry is not directly dependent upon the width of the vector from which the desired slice is obtained. More particularly, the number of inputs to a multiplexer implementation of the circuitry is remains fixed and is not dependent upon the width of the vector.

The resulting circuitry, whether the output stage is implemented using registers or a multiplexer, is able to generate all possible and legal slices of the vector while consuming significantly less area and fewer IC resources than conventional techniques. As noted, conventional techniques for implementing dynamic slice boundaries utilize a multiplexer in which the number of inputs is determined from the expression $n(n+1)/2$, where "n" is the size in bits of the vector.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined within this disclosure, the terms "a" and "an" mean one or more than one. The term "plurality," as defined herein, means two or more than two. The term "another," as defined herein, means at least a second or more. The term "coupled," as defined herein, means connected, whether directly without any intervening elements or indirectly with one or more intervening elements, unless otherwise indicated. Two elements may also be coupled mechanically, electrically, or communicatively linked through a communication channel, pathway, network, or system.

As defined herein, the term "automatically" means without user intervention. As defined herein, the term "user" means a human being. The term "and/or" as defined herein means any and all possible combinations of one or more of the associated listed items. The terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. Although the terms "first," "second," etc. may be used herein to describe various elements, these elements should not be limited by these terms, as these terms are only used to distinguish one element from another unless the context indicates otherwise.

As defined herein, the term "if" means "when," "upon," "in response to determining," "in response to detecting," "responsive to determining," or "responsive to detecting," depending on the context. Similarly, the phrase "if it is determined" or the phrase "if [a stated condition or event] is detected," as defined herein, means "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like may represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure may be realized in hardware or a combination of hardware and software. One or more aspects may be realized in a centralized fashion in one system or in a distributed fashion where different elements are spread across several interconnected systems. Any kind of data processing system or other apparatus adapted for carrying out at least a portion of the methods described herein is suited.

One or more aspects further may be embedded in a computer program product, which includes all the features enabling the implementation of the methods described herein. The computer program product includes a computer-readable data storage medium. As defined herein, the phrase "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as random access memory, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code may include, but is not limited to, a subroutine, a function, a procedure, an object method, an object implementation, an executable application, an applet, a servlet, source code, object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

A method of compiling a circuit design includes receiving the circuit design specified in an HDL, detecting, using a processor, a slice of a vector within the circuit design, determining that the slice is defined by a left slice boundary variable and a right slice boundary variable, and generating a hardware description from the circuit design using the processor. The hardware description is generated by including a first shifter circuit receiving the left slice boundary variable as an input signal, a second shifter circuit receiving the right slice boundary variable as an input signal, a control signal generator coupled to the first and second shifter circuits, and an output stage. The output stage, responsive to a control signal dependent upon an output from the first shifter circuit and an output from second shifter circuit, is configured to generate an output signal comprising newly received values from a data signal only for bit locations of the output signal corresponding to the slice.

Generating the hardware description may include including, within the output stage, a multiplexer having a first input and a second input. The first input may be configured to receive the data signal and the second input may be configured to receive an output signal from the multiplexer that is fed back.

Generating the hardware description may include including, within the output stage, a plurality of memory elements. Each memory element may receive a bit of the data signal. Each memory element may be controlled by one bit of the control signal.

Generating the hardware description may include providing a constant value of −2 (negative 2) as a data input to the first shifter circuit. The first shifter circuit is configured to shift the constant value of −2 by a number of bits specified by the left slice boundary variable.

Generating the hardware description may include providing a constant value of −1 (negative one) as a data input to the second shifter circuit. The second shifter circuit may be configured to shift the constant value of −1 by a number of bits specified by the right slice boundary variable.

Generating the hardware description also may include including an inverter and an AND circuit within the control signal generator, coupling an input of the inverter to an output of the first shifter circuit, coupling an output of the inverter to a first input of the AND circuit, and coupling an output of the second shifter to a second input of the AND circuit. An output of the AND circuit provides the control signal.

A circuit includes a first shifter circuit configured to generate a first shifted signal by shifting a first constant value by a first variable amount, a second shifter circuit configured to generate a second shifted signal by shifting a second constant value by a second variable amount, and a control signal generator configured to generate a control signal using the first shifted signal and the second shifted signal. The circuit includes an output stage coupled to the control signal and configured to receive a data signal. The output stage may be configured to generate an output signal including newly received values of the data signal only for bit locations selected by the control signal.

The control signal generator may include an inverter having an input coupled to an output of the first shifter circuit. The control signal generator further may include an AND circuit having a first input coupled to an output of the inverter, a second input coupled to an output of the second shifter circuit, and an output providing the control signal.

In one aspect, the output stage may include a multiplexer including a first input configured to receive the data signal, a second input configured to receive the output signal from the multiplexer fed back, and a selector port coupled to the output of the AND circuit. The number of inputs of the multiplexer is independent of a width of the data signal.

In another aspect, the output stage includes a plurality of memory elements, wherein each memory element receives one bit of the data signal. Each of the plurality of memory elements is controlled by one bit of the output of the AND circuit.

In one example, the plurality of memory elements may include a plurality of latches and the control signal is a gate signal to the plurality of latches. In another example, the plurality of memory elements include a plurality of registers and the control signal is a clock enable signal to the plurality of registers. In still another example, the plurality of memory elements include a plurality of registers. The output stage includes an AND circuit for each of the plurality of memory elements receiving a bit of the control signal as an input and a clock signal as an input. Each AND circuit is configured to perform a logical AND operation on the bit of the control signal and the clock signal and output a result signal to a clock input of one of the plurality of memory elements.

A system includes a processor programmed to initiate executable operations. The executable operations include receiving a circuit design specified in an HDL, detecting a slice of a vector within the circuit design, determining that the slice is defined by a left slice boundary variable and a right slice boundary variable, and generating a hardware description from the circuit design. The hardware description is generated by including a first shifter circuit receiving the left slice boundary variable as an input signal, a second shifter circuit receiving the right slice boundary variable as an input signal, a control signal generator coupled to the first and second shifter circuits, and an output stage. The output stage, responsive to a control signal dependent upon an output from the first shifter circuit and an output from second shifter circuit, is configured to generate an output signal including newly received values from a data signal only for bit locations of the output signal corresponding to the slice.

Generating the hardware description may include including, within the output stage, a multiplexer having a first input and a second input. The first input may be configured to receive the data signal and the second input may be configured to receive an output signal from the multiplexer that is fed back.

Generating the hardware description may include including, within the output stage, a plurality of memory elements. Each memory element may receive a bit of the data signal. Each memory element may be clocked by one bit of the control signal.

Generating the hardware description may include providing a constant value of −2 (negative 2) as a data input to the first shifter circuit. The first shifter circuit is configured to shift the constant value of −2 by a number of bits specified by the left slice boundary variable.

Generating the hardware description may include providing a constant value of −1 (negative one) as a data input to the second shifter circuit. The second shifter circuit is configured to shift the constant value of −1 by a number of bits specified by the right slice boundary variable.

Generating the hardware description may also include including an inverter and an AND circuit within the control signal generator, coupling an input of the inverter to an output of the first shifter circuit, coupling an output of the inverter to a first input of the AND circuit, and coupling an output of the second shifter to a second input of the AND circuit. An output of the AND circuit provides the control signal.

The features described within this disclosure may be embodied in other forms without departing from the spirit or essential attributes thereof. Accordingly, reference should be made to the following claims, rather than to the foregoing disclosure, as indicating the scope of such features and implementations.

What is claimed is:

1. A method of compiling a circuit design, comprising:
receiving the circuit design specified in a hardware description language;
detecting, using a processor, a slice of a vector within the circuit design;
determining that the slice is defined by a left slice boundary variable and a right slice boundary variable, wherein the bitwidth of the slice depends upon the left slice boundary variable and the right slice boundary variable; and
generating a hardware description comprising a netlist from the circuit design using the processor by including a first shifter circuit receiving the left slice boundary variable as an input signal, a second shifter circuit receiving the right slice boundary variable as an input signal, a control signal generator coupled to the first and second shifter circuits, and an output stage;
wherein the output stage, responsive to a control signal dependent upon an output from the first shifter circuit and an output from second shifter circuit, is configured to generate an output signal comprising newly received values from a data signal only for bit locations of the output signal corresponding to the slice.

2. The method of claim 1, wherein generating the hardware description comprises:
including, within the output stage, a multiplexer comprising a first input and a second input;
wherein the first input is configured to receive the data signal and the second input is configured to receive an output signal from the multiplexer that is fed back.

3. The method of claim 1, wherein generating the hardware description comprises:
including, within the output stage, a plurality of memory elements;
wherein each memory element receives a bit of the data signal; and
each memory element is controlled by one bit of the control signal.

4. The method of claim 1, wherein generating the hardware description comprises:
providing a constant value of −2 (negative 2) as a data input to the first shifter circuit;
wherein the first shifter circuit is configured to shift the constant value of −2 by a number of bits specified by the left slice boundary variable.

5. The method of claim 1, wherein generating the hardware description comprises:
providing a constant value of −1 (negative one) as a data input to the second shifter circuit;
wherein the second shifter circuit is configured to shift the constant value of −1 by a number of bits specified by the right slice boundary variable.

6. The method of claim 1, wherein generating the hardware description comprises:
including an inverter and an AND circuit within the control signal generator;
coupling an input of the inverter to an output of the first shifter circuit;
coupling an output of the inverter to a first input of the AND circuit; and
coupling an output of the second shifter to a second input of the AND circuit;

wherein an output of the AND circuit provides the control signal.

7. A circuit, comprising:
a first shifter circuit configured to perform logical shift operations and generate a first bit-shifted signal by shifting a first constant value by a first variable number of bits;
a second shifter circuit configured to perform logical shift operations and generate a second bit-shifted signal by shifting a second constant value by a second variable number of bits;
a control signal generator configured to generate a control signal using the first shifted signal and the second shifted signal; and
an output stage coupled to the control signal and configured to receive a data signal;
wherein the output stage is configured to generate an output signal comprising newly received values of the data signal only for bit locations selected by the control signal.

8. The circuit of claim 7, wherein the control signal generator comprises:
an inverter comprising an input coupled to an output of the first shifter circuit; and
an AND circuit comprising a first input coupled to an output of the inverter, a second input coupled to an output of the second shifter circuit, and an output providing the control signal.

9. The circuit of claim 8, wherein the output stage comprises:
a multiplexer comprising a first input configured to receive the data signal, a second input configured to receive the output signal from the multiplexer fed back, and a selector port coupled to the output of the AND circuit.

10. The circuit of claim 9, wherein the number of inputs of the multiplexer is independent of a width of the data signal.

11. The circuit of claim 8, wherein the output stage comprises:
a plurality of memory elements, wherein each memory element receives one bit of the data signal;
wherein each of the plurality of memory elements is controlled by one bit of the output of the AND circuit.

12. The circuit of claim 11, wherein the plurality of memory elements comprise a plurality of latches and the control signal is a gate signal to the plurality of latches.

13. The circuit of claim 11, wherein the plurality of memory elements comprise a plurality of registers and the control signal is a clock enable signal to the plurality of registers.

14. The circuit of claim 11, wherein:
the plurality of memory elements comprise a plurality of registers;
the output stage comprises an AND circuit for each of the plurality of memory elements receiving a bit of the control signal as an input and a clock signal as an input; and
wherein each AND circuit is configured to perform a logical AND operation on the bit of the control signal and the clock signal and outputs a result signal to a clock input of one of the plurality of memory elements.

15. A system, comprising:
a processor programmed to initiate executable operations comprising:
receiving a circuit design specified in a hardware description language;
detecting a slice of a vector within the circuit design;
determining that the slice is defined by a left slice boundary variable and a right slice boundary variable, wherein the bitwidth of the slice depends upon the left slice boundary variable and the right slice boundary variable; and
generating a hardware description comprising a netlist from the circuit design by including a first shifter circuit receiving the left slice boundary variable as an input signal, a second shifter circuit receiving the right slice boundary variable as an input signal, a control signal generator coupled to the first and second shifter circuits, and an output stage;
wherein the output stage, responsive to a control signal dependent upon an output from the first shifter circuit and an output from second shifter circuit, is configured to generate an output signal including newly received values from a data signal only for bit locations of the output signal corresponding to the slice.

16. The system of claim 15, wherein generating the hardware description comprises:
including, within the output stage, a multiplexer comprising a first input and a second input;
wherein the first input is configured to receive the data signal and the second input is configured to receive an output signal from the multiplexer that is fed back.

17. The system of claim 15, wherein generating the hardware description comprises:
including, within the output stage, a plurality of memory elements;
wherein each memory element receives a bit of the data signal; and
each memory element is clocked by one bit of the control signal.

18. The system of claim 15, wherein generating the hardware description comprises:
providing a constant value of −2 (negative 2) as a data input to the first shifter circuit;
wherein the first shifter circuit is configured to shift the constant value of −2 by a number of bits specified by the left slice boundary variable.

19. The system of claim 15, wherein generating the hardware description comprises:
providing a constant value of −1 (negative one) as a data input to the second shifter circuit;
wherein the second shifter circuit is configured to shift the constant value of −1 by a number of bits specified by the right slice boundary variable.

20. The system of claim 15, wherein generating the hardware description comprises:
including an inverter and an AND circuit within the control signal generator;
coupling an input of the inverter to an output of the first shifter circuit;
coupling an output of the inverter to a first input of the AND circuit; and
coupling an output of the second shifter to a second input of the AND circuit;
wherein an output of the AND circuit provides the control signal.

* * * * *